(12) United States Patent
Wildhagen et al.

(10) Patent No.: US 7,170,950 B2
(45) Date of Patent: Jan. 30, 2007

(54) DRM/AM SIMULCAST

(75) Inventors: Jens Wildhagen, Weinstadt (DE); Dietmar Schill, Winnenden (DE)

(73) Assignee: Sony Deutschland GmbH, Cologne (DE)

( * ) Notice: Subject to any disclaimer, the term of this patent is extended or adjusted under 35 U.S.C. 154(b) by 768 days.

(21) Appl. No.: 10/191,190

(22) Filed: Jul. 9, 2002

(65) Prior Publication Data

US 2003/0012300 A1    Jan. 16, 2003

(30) Foreign Application Priority Data

Jul. 11, 2001 (EP) .................. 01116934
Aug. 3, 2001 (EP) .................. 01118908

(51) Int. Cl.
*H03C 1/52*    (2006.01)

(52) U.S. Cl. ..................... 375/295; 375/300

(58) Field of Classification Search ............. 375/300, 375/270, 259, 268, 295, 353, 260, 277, 285, 375/301; 370/329, 533; 455/3.01, 47, 108, 455/109

See application file for complete search history.

(56) References Cited

U.S. PATENT DOCUMENTS

| | | | |
|---|---|---|---|
| 5,535,215 A * | 7/1996 | Hieatt, III | 370/329 |
| 5,588,022 A | 12/1996 | Dapper et al. | |
| 5,809,065 A | 9/1998 | Dapper et al. | |
| 6,005,894 A * | 12/1999 | Kumar | 375/270 |

* cited by examiner

*Primary Examiner*—Dac Ha
*Assistant Examiner*—Jaison Joseph
(74) *Attorney, Agent, or Firm*—Oblon, Spivak, McClelland, Maier & Neustadt, P.C.

(57) ABSTRACT

An AM simulcast broadcast signal combining a digital transmission signal and an analogue transmission signal in one transmission channel. The digital transmission signal is modulated to one sideband of a carrier of the transmission channel and a correcting signal (C) is modulated to the other sideband of the carrier of the transmission channel, which correcting signal (C) is determined so that the envelope demodulation of the transmission channel represents the analogue transmission signal.

12 Claims, 1 Drawing Sheet

DRM/AM SIMULCAST

BACKGROUND OF THE INVENTION

The present invention is related to an AM simulcast broadcast signal combining a digital transmission signal and an analogue transmission signal in one transmission channel, a method to generate such a signal, and an AM simulcast broadcast signal generator embodying said method.

DRM (Digital Radio Mondeal) is a digital service in the broadcasting bands below 30 MHz. A simultaneous transmission of the conventional analogue and the new digital service will simplify and accelerate the introduction of the DRM system, since listeners of the analogue service are not lost during the introduction of DRM.

Basically, a simulcast technology is already known for AM bands. The first known possibility is to use a half channel analogue DSB (Double Sideband Modulation), and a half channel digital DSB. The disadvantage is that audio bandwidth for the analogue signal is reduced by 50%, a crosstalk from the digital half channel to the analogue half channel exists, and existing analogue receivers which do not use modern technology, i.e. which use standard filters, get distorted. The second known possibility is the IBOC (In Band On Channel) system, wherein the digital signal is modulated orthogonal to the unchanged analogue signal. The disadvantage is a significantly increased dynamic range which is required in the digital receiver, that crosstalk from the analogue signal to the digital signal and vice versa exists, and that the digital and the analogue systems get distorted.

BRIEF SUMMARY OF THE INVENTION

Therefore, it is the object underlying the present invention to define a new method for simulcasting a digital and an analogue transmission signal in the same channel.

The AM simulcast broadcast signal combining a digital transmission signal and an analogue transmission signal in one transmission channel according to the present invention is built so that the digital transmission signal is modulated to one sideband of a carrier of the transmission channel and a correcting signal is modulated to the other sideband of the carrier of the transmission channel, which correcting signal is determined in a way that the envelope demodulation of the transmission channel represents the analogue transmission signal.

This AM simulcast broadcast signal according to the present invention allows the reception of the analogue signal with unchanged audio bandwidth while introducing a digital signal into the same frequency slot. The analogue signal continues to be receivable with a simple envelope detector. Further, no crosstalk from the analogue signal to the digital signal exists and crosstalk distortions from the digital signal to the analogue signal exists only in AM receivers with low-quality, asymetrical, IF (Intermediate Frequency) filter characteristics. Furthermore, a full compatibility to the existing AM system is given and a full audio bandwidth of 5 kHz can be assured.

Further preferrably, in the AM simulcast broadcast signal according to the present invention, said correcting signal is generated in an iterative process according to which said digital transmission signal is modulated to said one sideband, said analogue transmission signal is modulated to said other sideband, said both sidebands are added and said carrier signal is added at the centre of said both sidebands, the so generated simulcast signal gets envelope demodulated, an error signal is generated by subtracting the envelope demodulated simulcast signal from the analogue transmission signal which is delayed according to the processing time to generate and demodulate the simulcast signal, the error signal is weighted with a time-variant or time-invariant variable, a new analogue transmission signal is generated by adding the weighted error signal to the delayed analogue transmission signal, the digital transmission signal is delayed corresponding to the delay of the analogue transmission signal, wherein the whole procedure is repeated N times with another time-variant or time-invariant variable and with the newly generated analogue transmission signal as said analogue transmission signal, wherein N is a positive integer including zero and is determined according to the wanted accuracy of the correcting signal which is determined as the newly generated analogue transmission signal after the $N^{th}$ iteration.

The method to generate an AM simulcast broadcast signal combining a digital transmission signal and an analogue transmission signal in one transmission channel, according to the present invention comprises the steps of modulating the digital transmission signal to one sideband of a carrier of the transmission channel, and modulating a correcting signal to the other sideband of the carrier of the transmission channel, which correcting signal is determined so that the envelope demodulation of the transmission channel represents the analogue transmission signal.

Further preferrably, in the method according to the present invention the step of generating said correcting signal is performed in an iterative process with the steps of:

modulating said digital transmission signal to said one sideband, modulating said analogue transmission signal to said other sideband, adding said both sidebands and said carrier signal at the centre of said both sidebands, envelope demodulating the so generated simulcast signal, generating an error signal by subtracting the envelope demodulated simulcast signal from the analogue transmission signal which is delayed according to the processing time to generate and demodulate the simulcast signal, weighting the error signal with a time-variant or time-invariant variable, generating a new analogue transmission signal by adding the weighted error signal to the delayed analogue transmission signal, delaying the digital transmission signal corresponding to the delay of the analogue transmission signal, wherein the whole procedure is repeated N times with another time-variant or time-invariant variable and with the newly generated analogue transmission signal as said analogue transmission signal, wherein N is a positive integer including zero and is determined according to the wanted accuracy of the correcting signal which is determined as the newly generated analogue transmission signal after the $N^{th}$ iteration.

Therewith, according to the present invention, the correcting signal is preferably generated in an iterative process wherein the final correcting signal is determined on basis of an error signal between an analogue transmission signal which is recalculated based on a simulcast signal generated with an assumed or intermediate correcting signal and the analogue transmission signal which should actually be transmitted.

An AM simulcast broadcast signal generator for a transmission of a digital transmission signal and an analogue transmission signal in one transmission channel, according to the present invention comprises a first modulator to modulate the digital transmission signal to one sideband of a carrier of the transmission channel, and a second modulator to modulate a correcting signal to the other sideband of the carrier of the transmission channel, which correcting signal is determined so that the envelope demodulation of the transmission channel represents the analogue transmission signal.

Preferably, the broadcast signal generator according to the present invention further comprises a first adder to add said both sidebands and a carrier signal at the centre of both sidebands.

Further preferably, the broadcast signal generator according to the present invention further comprises a correcting signal generator comprising:
  a third modulator to modulate said digital transmission signal to said one sideband,
  a fourth modulator to modulate said analogue transmission signal to said other sideband,
  a second adder to add said both sidebands,
  a first envelope demodulator to envelope demodulate the so generated simulcast signal,
  a first delay element to delay the analogue transmission signal according to the processing time to generate and demodulate the respective simulcast signal,
  a first subtracter to generate an error signal by subtracting the envelope demodulated simulcast signal from the delayed analogue transmission signal,
  a first multiplier to weight the error signal with a time-variant or time-invariant variable,
  a third adder to generate the correcting signal or an intermediate correcting signal by adding the weighted error signal to the delayed analogue transmission signal,
  a second delay element to delay the digital transmission signal according to the processing time to generate and demodulate the respective simulcast signal.

Still further preferably, said correcting signal generator within the broadcast signal generator according to the present invention further comprises N correcting signal units respectively comprising:
  a fifth modulator to modulate said intermediate correcting signal to said other sideband,
  a fourth adder to add said both sidebands,
  a second envelope demodulator to envelope demodulate the so generated simulcast signal,
  a third delay element to delay the intermediate correcting signal according to the processing time to generate and demodulate the respective simulcast signal,
  a second subtracter to generate an error signal by subtracting the envelope demodulated simulcast signal from the delayed intermediate correcting signal,
  a second multiplier to weight the error signal with a time-variant or time-invariant variable,
  a fifth adder to generate the correcting signal or an intermediate correcting signal by adding the weighted error signal to the delayed intermediate correcting signal, wherein N is a positive integer including zero and is determined according to the wanted accuracy of the correcting signal which is determined after the $N^{th}$ correcting signal unit.

Still further preferably, said N correcting signal units within said correcting signal generator respectively further comprise:
  a fifth modulator to modulate said delayed digital transmission signal to said one sideband,
  a fourth delay element to delay the digital transmission signal according to the processing time to generate and demodulate the respective simulcast signal.

Alternatively thereto, said N correcting signal units within said correcting signal generator respectively further comprise:
  a fourth delay element to delay the digital transmission signal which is modulated to said one sideband according to the processing time to generate and demodulate the respective simulcast signal.

According to the present invention, preferably a DRM signal is transmitted as said digital transmission signal. However, also digital transmission signals generated according to other standards might be transmitted.

According to the present invention, preferably a conventional AM signal is transmitted as said AM analogue transmission signal.

Further objects and features of the DRM/AM simulcast system according to the present invention will become apparent from the following description of an exemplary embodiment thereof taken in conjunction with the accompanying figures, wherein

According to the present invention the digital and the analogue signal are combined in one channel. To avoid distortions of the digital system, the digitally modulated signal is transmitted in one sideband of the channel which allows a distortion-free demodulation of the digital modulated signal in the receiver.

Figure 2:
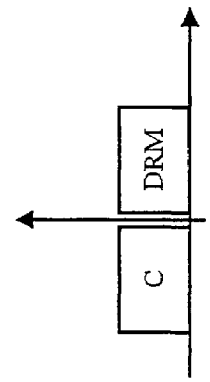
FIG. 2 shows the spectrum of the simulcast signal according to the present invention.

Further, the simulcast signal is backward compatible with the existing AM broadcast system, since the envelope of the simulcast signal ideally represents the analogue signal. According to the present invention the backward compatibility of the simulcast signal is assured by a modulation of the unmodulated sideband of the AM channel with a correcting signal C. The spectrum of the simulcast signal according to the present invention is shown in FIG. 2. The upper sideband of the channel comprises the digitally modulated signal, e.g. the DRM signal, and the lower sideband comprises the correcting signal C. At the center of both sidebands a carrier is added so that an estimation of the simulcast signal can be obtained. Of course, it is also possible that the digitally modulated signal is transmitted in the lower sideband of the channel and the correcting signal is transmitted in the upper sideband thereof.

The envelope demodulation of the simulcast signal according to the present invention results in the undisturbed analogue audio signal with the full audio bandwidth. In case of a 10 kHz AM channel, the audio bandwidth of the analogue signal is 5 kHz. Therefore, the audio bandwidth is not changed by the simulcast signal according to the present invention.

The audio signal contains distortions only in case of channel distortions or distortions of the frequency response of the analogue AM/IF filter, i.e. in case of a AM receiver with low-quality, asymetrical, IF (Intermediate Frequency) filter characteristics.

The digital modulated DRM signal is not disturbed by the analogue signal.

The generation of the correcting signal C is preferably an iterative process. Such an iterative method might modulate the DRM signal to the upper sideband and the analogue signal to the lower sideband or vice versa. Then, the carrier is added at the center of both sidebands to get an estimation of the simulcast signal. The estimation of the full simulcast signal, comprising upper sideband USB, lower sideband LSB and carrier, is demodulated by an envelope demodulator. Thereafter, the envelope demodulated analogue signal is subtracted from the analogue signal to get an error signal. The error signal is followingly weighted with a constant k before, at the next stage, the error signal is added to the analogue signal to get a new estimation of the LSB signal representing the analogue audio signal. This iteration is repeated N times, until the correcting signal C is obtained and the simulcast signal according to the present invention is generated and transmitted.

The constant k might also be variable depending on the amplitude of the analogue signal and/or digital signal and/or the error signal.

Figure 1:
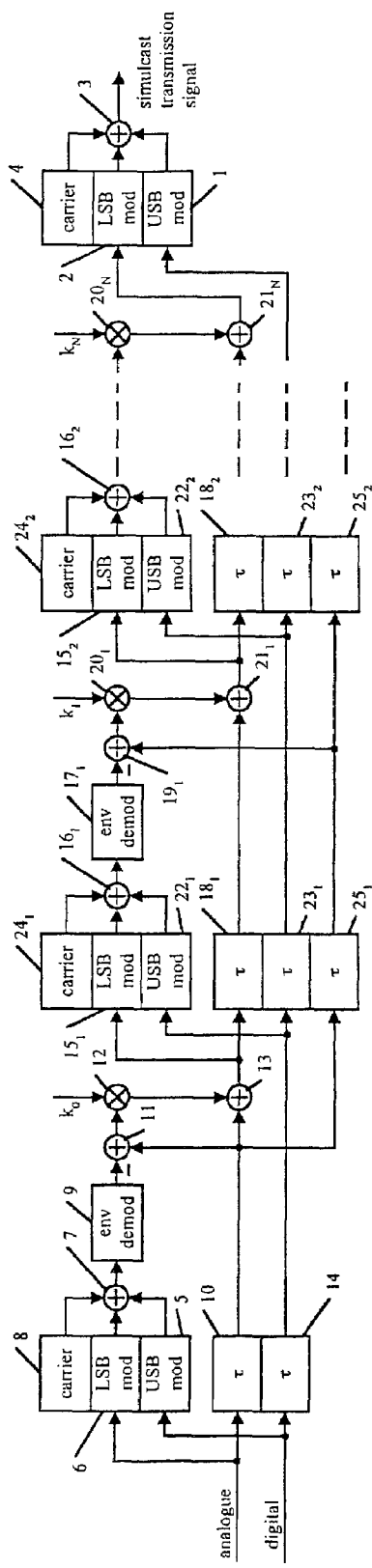
FIG. 1 shows an AM simulcast broadcast signal generator according to the present invention.

FIG. 1 shows an exemplary AM simulcast broadcast generator according to a preferred embodiment of the present invention. The simulcast broadcast signal according to the present invention is generated by a first modulator 1 which modulates the digital transmission signal to one sideband of a carrier of the transmission channel, here the upper sideband USB, and a second modulator 2 which modulates the correcting signal C to the upper sideband of the carrier of the transmission channel, here to the lower sideband LSD.

Further, to generate the simulcast broadcast signal according to the present invention a first adder 3 adds said both sidebands and possibly the carrier signal at the center of both sidebands, which carrier signal is generated by a carrier signal generator 4.

The digital transmission signal supplied to the first modulator 1 corresponds to the correcting signal C in time, i.e. is delayed during the generation of the correcting signal C to match therewith.

Further, the broadcast signal generator according to the present invention shown in FIG. 1 comprises a correcting signal generator which—in this case—also delays the digital signal. The correcting signal generator comprises a third modulator 5 to modulate said digital transmission signal to said one sideband, i.e. here to the upper sideband, a fourth modulator 6 to modulate the analogue transmission signal to the other sideband, here the lower sideband, a second adder 7 to add said both sidebands and the carrier signal which is generated by a second carrier signal generator 8 at the center of said both sidebands. Further, the correcting signal generator comprises a first envelope demodulator 9 to envelope demodulate the so generated simulcast signal, a first delay element 10 to delay the analogue transmission signal according to the processing time to generate a demodulated respective simulcast signal, a first subtractor 11 to generate an error signal by subtracting the envelope demodulated simulcast signal from the delayed analogue transmission signal, a first multiplier 12 to weight the error signal with a time-variant or time-invariant variable, a third adder 13 to generate the correcting signal C or an intermediate correcting signal by adding the weighted error signal to the delayed analogue transmission signal, and a second delay element to delay the digital transmission signal according to the processing time needed to generate and demodulate the respective simulcast signal.

As stated before, these elements of the correcting signal generator which can be regarded as one correcting signal unit either generate the correcting signal or an intermediate correcting signal. The correcting signal generated by this one correcting signal unit is normally only a rough estimation and would not necessarily lead to a proper transmission to the analogue transmission signal. However, the quality thereof might also be regarded as sufficient. In case this should not be sufficient, the resulting signal supplied from the third adder 13 might be processed in the same way as the analogue transmission signal was processed before by N similar following correcting signal unit(s). In this case also the digital transmission signal will get accordingly delayed. Such a repetition of the processing might be performed N times, i.e. by N similar following correcting signal unit(s), wherein N is a positive integer including zero and is determined according to the wanted accuracy of the correcting signal which is determined after the $N^{th}$ correcting signal unit.

The invention claimed is:

1. A method of generating an AM simulcast broadcast signal combining a digital transmission signal and an analogue transmission signal in one transmission channel, comprising the steps of:
    modulating the digital transmission signal to one sideband of a carrier of the transmission channel; and
    modulating a correcting signal (C), which is distinct from the analogue transmission signal, to the other sideband of the carrier of the transmission channel,
    wherein the correcting signal (C) is determined so that the envelope demodulation of the transmission channel represents the analogue transmission signal.

2. The method of claim 1, further comprising generating said correcting signal (C) in an iterative process, comprising the steps of:
    modulating said digital transmission signal to said one sideband;
    modulating said analogue transmission signal to said other sideband;
    adding said both sidebands;
    envelope demodulating the generated simulcast signal;
    generating an error signal by subtracting the envelope demodulated simulcast signal from the analogue transmission signal which is delayed according to the processing time to generate and demodulate the simulcast signal;
    weighting the error signal with a time-variant or time-invariant variable ($k_n$; $0 \leq n \leq N$);
    generating a new analogue transmission signal by adding the weighted error signal to the delayed analogue transmission signal;
    delaying the digital transmission signal corresponding to the delay of the analogue transmission signal,
    wherein each step included in generating said correcting signal (C) in an iterative process is repeated N times with another time-variant or time-invariant variable and with the newly generated analogue transmission signal as said analogue transmission signal, wherein N is a positive integer including zero and is determined according to the wanted accuracy of the correcting signal (C) which is determined as the newly generated analogue transmission signal after the Nth iteration.

3. The method of claim 1, wherein:
said digital transmission signal is a DRM signal.

4. The method of claim 1, wherein: said analogue transmission signal is a conventional AM signal.

5. An AM simulcast broadcast signal generator for transmitting a digital transmission signal and an analogue transmission signal in one transmission channel, comprising:
a first modulator configured to modulate the digital transmission signal to one sideband of a carrier of the transmission channel; and
a second modulator configured to modulate a correcting signal (C), which is distinct from the analogue transmission signal, to the other sideband of the carrier of the transmission channel,
wherein said second modulator is configured to determine said correcting signal (C) so that an envelope demodulation of the transmission channel represents the analogue transmission signal.

6. The broadcast signal generator of claim 5, further comprising: a first adder to add said both sidebands.

7. The broadcast signal generator of claim 6, further comprising:
a correcting signal generator comprising
a third modulator configured to modulate said digital transmission signal to said one sideband;
a fourth modulator configured to modulate said analogue transmission signal to said other sideband;
a second adder configured to add said both sidebands;
a first envelope demodulator configured to envelope demodulate the so generated simulcast signal;
a first delay element configured to delay the analogue transmission signal according to the processing time to generate and demodulate the respective simulcast signal;
a first subtracter configured to generate an error signal by subtracting the envelope demodulated simulcast signal from the delayed analogue transmission signal;
a first multiplier configured to weight the error signal with a time-variant or time-invariant variable;
a third adder configured to generate the correcting signal (C) or an intermediate correcting signal by adding the weighted error signal to the delayed analogue transmission signal; and
a second delay element configured to delay the digital transmission signal according to the processing time to generate and demodulate the respective simulcast signal.

8. The broadcast signal generator of claim 7, wherein said correcting signal generator further comprises N correcting signal units respectively comprising:
a fifth modulator configured to modulate said intermediate correcting signal to said other sideband;
a fourth adder configured to add said both sidebands;
a second envelope demodulator configured to envelope demodulate the so generated simulcast signal;
a third delay element configured to delay the intermediate correcting signal according to the processing time to generate and demodulate the respective simulcast signal;
a second subtracter configured to generate an error signal by subtracting the envelope demodulated simulcast signal from the delayed intermediate correcting signal;
a second multiplier configured to weight the error signal with a time-variant or time-invariant variable;
a fifth adder configured to generate the correcting signal or an intermediate correcting signal by adding the weighted error signal to the delayed intermediate correcting signal,
wherein N is a positive integer including zero and is determined according to the wanted accuracy of the correcting signal (C) which is determined after the Nth correcting signal unit.

9. The broadcast signal generator of claim 8, wherein said N correcting signal units respectively further comprise:
a fifth modulator configured to modulate said delayed digital transmission signal to said one sideband; and
a fourth delay element configured to delay the digital transmission signal according to the processing time to generate and demodulate the respective simulcast signal.

10. The broadcast signal generator of claim 8, wherein said N correcting signal units respectively further comprise:
a fourth delay element configured to delay the digital transmission signal which is modulated to said one sideband according to the processing time to generate and demodulate the respective simulcast signal.

11. The broadcast signal generator of claim 5, wherein:
said digital transmission signal is a DRM signal.

12. The broadcast signal generator of claim 5, wherein:
said analogue transmission signal is a conventional AM signal.

* * * * *